United States Patent
Huber

(10) Patent No.: US 6,693,485 B1
(45) Date of Patent: Feb. 17, 2004

(54) DIFFERENTIAL AMPLIFIERS WITH INCREASED INPUT RANGES

(75) Inventor: Brian W. Huber, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/231,920

(22) Filed: Aug. 29, 2002

(51) Int. Cl.[7] .................................................. G06G 7/12
(52) U.S. Cl. ...................... 327/563; 327/562; 330/252; 330/278
(58) Field of Search ................................. 327/560–563; 330/252–254, 257–261, 277, 278, 288, 296, 301

(56) References Cited

U.S. PATENT DOCUMENTS

| | | | | |
|---|---|---|---|---|
| 3,641,450 A | * | 2/1972 | Lunn ......................... 330/254 |
| 4,517,525 A | | 5/1985 | Dijkmans et al. ........... 330/260 |
| 4,769,616 A | | 9/1988 | Barbu ........................ 330/252 |
| 4,977,378 A | * | 12/1990 | Tero ............................. 330/258 |
| 5,361,040 A | * | 11/1994 | Barrett, Jr. ................... 330/253 |
| 5,619,169 A | * | 4/1997 | Matsuura ..................... 330/254 |
| 5,783,953 A | | 7/1998 | Bosnyak et al. ............. 327/101 |
| 5,793,551 A | | 8/1998 | Ngo et al. ..................... 360/67 |
| 6,028,466 A | | 2/2000 | Hartley ......................... 327/328 |
| 6,064,613 A | | 5/2000 | Wang ........................... 365/207 |
| 6,377,120 B1 | | 4/2002 | Hsieh ........................... 330/253 |
| 6,456,144 B2 | | 9/2002 | Catala .......................... 327/359 |
| 6,472,908 B1 | | 10/2002 | Smetana ....................... 327/52 |
| 6,504,435 B1 | | 1/2003 | Martins ........................ 330/292 |

* cited by examiner

Primary Examiner—Minh Nguyen
(74) Attorney, Agent, or Firm—Schwegman, Lundberg, Woessner & Kluth, P.A.

(57) ABSTRACT

An amplifying circuit includes a differential amplifier for receiving input signals to generate output signals. A current regulator unit and an input enhancement unit allow the input signals to exceed the normal input range of the differential amplifier. The current regulator unit regulates current in the differential amplifier. The input enhancement unit steers current from a first current path to a second current path based on signal levels of the input signals.

48 Claims, 10 Drawing Sheets

DIFFERENTIAL AMPLIFIERS WITH INCREASED INPUT RANGES

TECHNICAL FIELD

The present invention relates generally to electronic circuits, and in particular to input ranges in differential amplifiers.

BACKGROUND

Many electrical circuits have differential amplifiers for amplifying a difference in voltages between two input signals to produce amplified differential output signals.

FIG. 1 shows a typical differential amplifier 100 having driver transistors N1 and N2, load transistors P1 and P2, and a current source N3. Differential amplifier 100 receives differential signals INA and INB and outputs differential output signals OA and OB.

Differential amplifier 100 usually has a lower limit and an upper limit for the signal levels of the INA and INB signals. These limits specify an input range. Differential amplifier 100 operates properly when the INA and INB signals stay within the input range.

When the INA and INB signals exceed the lower limit, N1 and N2 could turn off. In the opposite, when the INA and INB signals exceed the upper limit, transistors N1 and N2 could operate in linear mode and act as resistors. In either case, differential amplifier 100 operates improperly when the INA and INB signals exceed the input range.

SUMMARY OF THE INVENTION

The various embodiments of the present invention provide methods and circuits for increasing the normal input range of differential amplifiers to allow the input signals to exceed the lower and upper limits of the normal input range.

In one aspect, a circuit includes a differential amplifier having a first differential input node and a second amplifier input node for receiving differential input signals, and having an amplifier current source. A current regulator has a pair of input transistors for receiving the differential input signals to regulate a current of the differential amplifier In another aspect, a circuit includes a differential amplifier having a pair of driver transistors for receiving input signals. A current regulator regulates a current of a first current path of the differential amplifier based on first signal levels of the input signals. An input enhancement unit steers a majority of the current from the first current path to a second current path based on second signal levels of the input signals.

In yet another aspect, a method includes receiving input signals at a differential amplifier. The method also includes regulating a current of a first current path of the differential amplifier based on first signal levels of the input signals. The method further includes steering current from the first current path to a second current path based on second signal levels of the input signals.

DETAILED DESCRIPTION OF THE INVENTION

Figure 1:
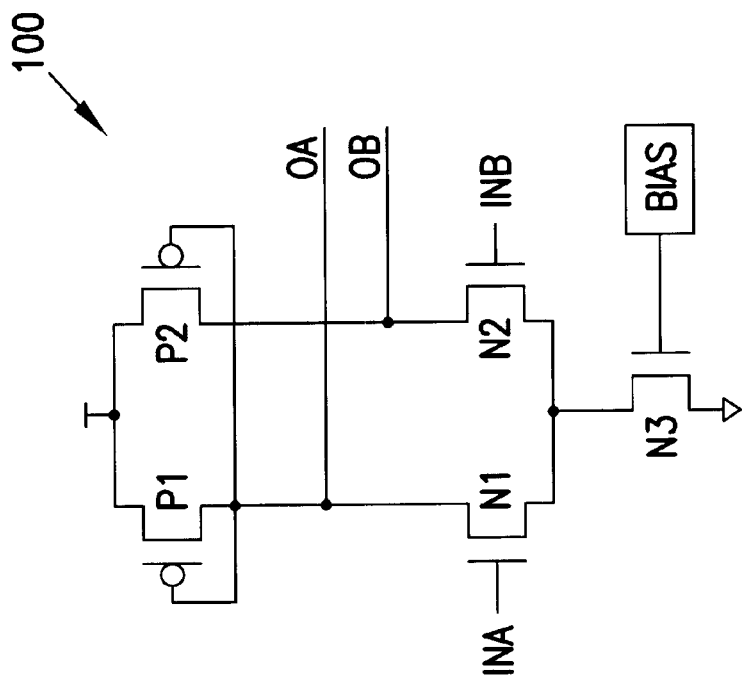
FIG. 1 shows a prior art differential amplifier.

The following description and the drawings illustrate specific embodiments of the invention sufficiently to enable those skilled in the art to practice it. Other embodiments may incorporate structural, logical, electrical, process, and other changes. In the drawings, like numerals describe substantially similar components throughout the several views. Examples merely typify possible variations. Portions and features of some embodiments may be included in or substituted for those of others. The scope of the invention encompasses the full ambit of the claims and all available equivalents.

Figure 2A:
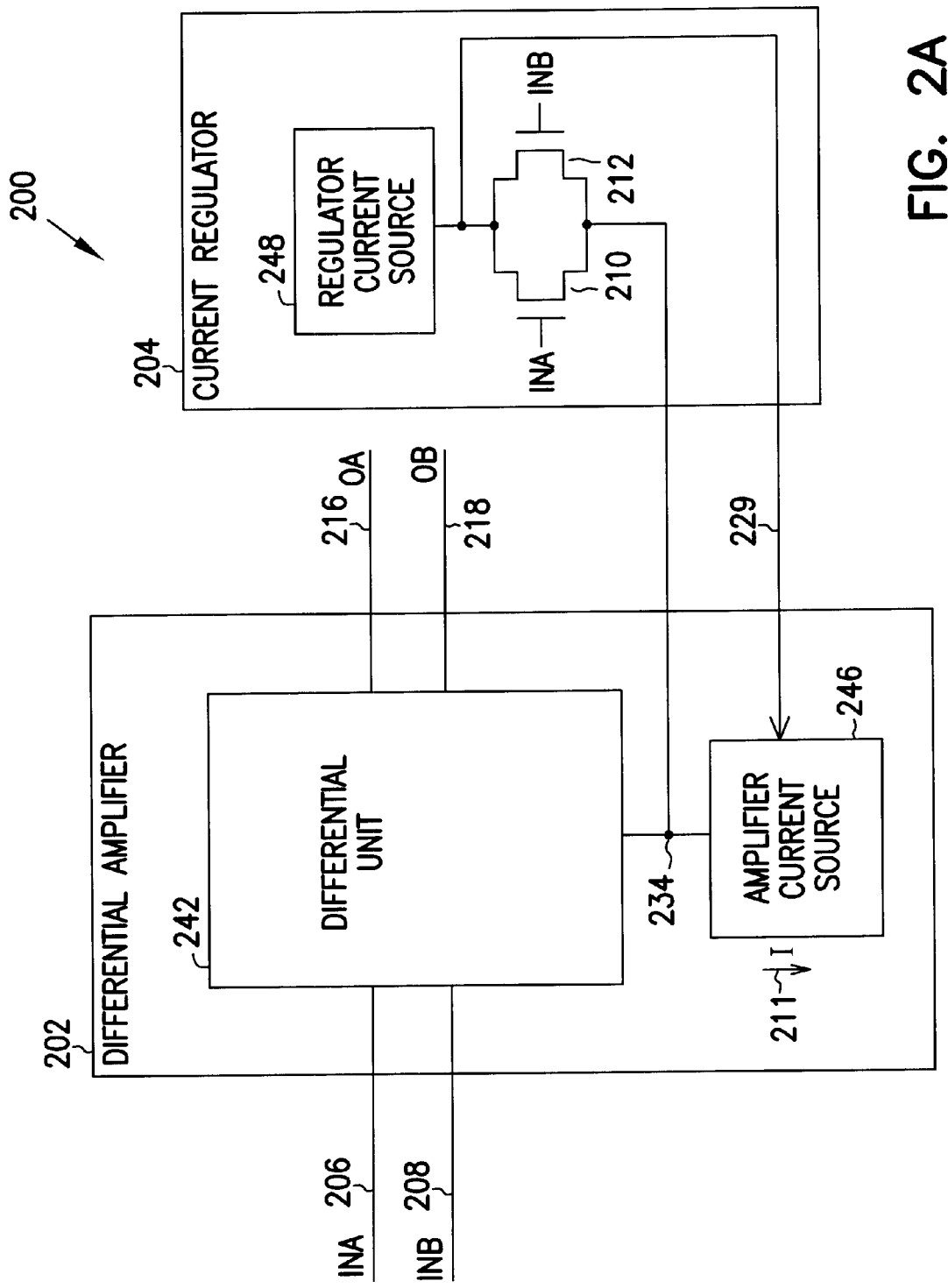
FIG. 2A shows an amplifying circuit according to an embodiment of the invention.

FIG. 2A shows an amplifying circuit 200 according to an embodiment of the invention. Amplifying circuit 200 includes a differential amplifier 202 having a differential unit 242, and an amplifier current source 246. Differential unit 242 receives differential input signals INA and INB at differential input nodes 206 and 208 to generate differential output signals OA and OB at differential output nodes 216 and 218. A current regulator 204 has a pair of input transistors 210 and 212 for receiving differential input signals INA and INB. Input transistors 210 and 212 have sources connecting to common node 234. Input transistors 210 and 212 have drains connected to current control node 229. Regulator current source 248 provides a current source to current control node 229.

Current regulator 204 controls the amplifier current source 246 to improve the input range of differential amplifier 202.

Figure 2B:
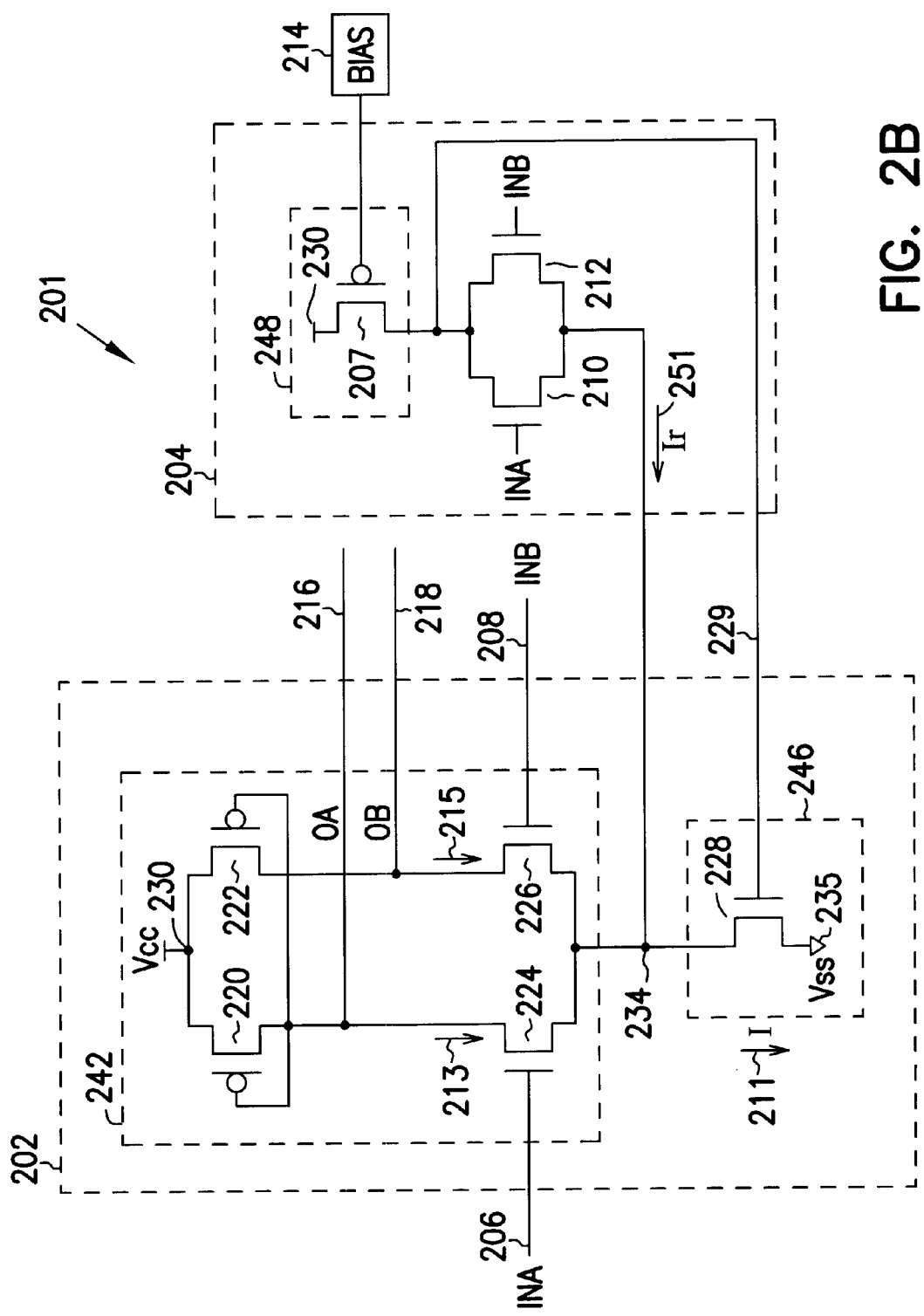
FIG. 2B shows an amplifying circuit according to an embodiment of the invention.

FIG. 2B shows an amplifying circuit 201 according to another embodiment of the invention. Differential amplifier 202 is similar to the differential amplifier of FIG. 2A. Differential amplifier 202 is connected to a current regulator 204. Differential unit 242 includes a pair of driver transistors 224 and 226 connected to input nodes 206 and 208 for receiving input signals INA and INB. A pair of load transistors 220 and 222 connect to transistors 224 and 226 at output nodes 216 and 218, which provide output signals OA and OB. Amplifier current source 246 includes a current source transistor 228 connected to a common node 234, shared by sources of transistors 224 and 226, to source a current I on a current path 211. Differential amplifier 202 has supply nodes 230 and 235. Supply node 230 connects to Vcc and supply node 235 connects to Vss. In embodiments represented by FIG. 2B, Vcc is the supply voltage of differential amplifier 202 and Vss is ground. In some embodiments, Vss is non-ground and has a smaller voltage than Vcc.

Transistors 224, 226, 228, 210, and 212 are n-channel metal oxide semiconductor field effect transistors (NMOSFETs), also referred to as "NFETS" or "NMOS".

Transistors 220, 222, and 207 are p-channel metal oxide semiconductor field effect transistors (PMOSFETs), also referred to as "PFETs" or "PMOS". Other types of transistors can also be used in place of the NMOS and PMOS transistors of FIG. 2B. For example, embodiments exist that use bipolar junction transistors (BJTs) and junction field effect transistors (JFETs). In some embodiments, the types of transistors and Vcc and Vss can be reversed. For example, transistors 224, 226 228, 210, and 212 can be replaced with PMOS transistors and transistors 220,222, and 207 can be replaced with NMOS transistors while swapping Vcc and Vss supplies. One of ordinary skill in the art will understand that many other types of transistors can be used in alternative embodiments of the invention.

Current regulator 204 includes a pair of regulator transistors 210 and 212, which receive the same INA and INB signals as differential amplifier 202. Transistors 210 and 212 have a common drain connected to the gate of transistor 228 at node 229 and a common source connected to common node 234. Regulator current source 248 includes a current source device 207 that connects to node 229 and is controlled by a bias unit 214. In embodiments represented by FIG. 2B, current source device 207 is a transistor. In other embodiments, however, current source device 207 can be other types of elements or even a network of various elements. Differential amplifier 202 amplifies the difference in voltage levels of the INA and INB signals to generate the OA and OB signals. An amount of current I that flows through transistor 228 is based on voltage levels of the INA and INB signals and regulator current source 248. Current I is the sum of the currents on current paths 213, 215, and current Ir on current path 251.

Figure 3:
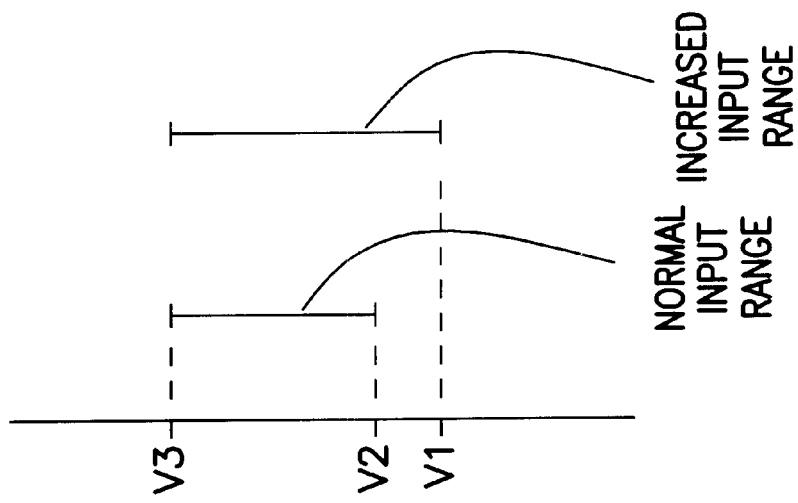
FIG. 3 shows an input range for the amplifying circuit of FIG. 2A or 2B.

Current regulator 204 regulates current I of current path 211 to increase the input range of differential amplifier 202. FIG. 3 shows two input ranges: a normal input range and an increased input range. V3 is the upper limit of both ranges. V2 is the lower limit of the normal input range. V1 is the lower limit of the increased input range. V1 has a lower value than V2. V1, V2, and V3 are voltage levels. The input range of differential amplifier 202 is the increased input range. The normal input range shown in FIG. 3 serves only as a reference range for comparison purposes.

The normal input range in FIG. 3 refers to the range of differential amplifier 202 without the inclusion of current regulator 204. The increased input range is the input range of differential amplifier 202 with the inclusion of current regulator 204. As shown in FIG. 3, the increased input range is larger than the normal input range by a difference between V1 and V2.

The input range of differential amplifier 202 depends in part on the threshold voltages of transistors 224 and 226. A threshold voltage (Vt) of a transistor is a voltage at which the transistor begins to conduct (turn on). In embodiments represented by FIG. 2B, transistors 224 and 226 have the same Vt. Transistors 224, 226, and 228 operate in saturation mode when the INA and INB signals are between V2 and V3.

In some embodiments, the lower limit of the input range of differential amplifier 202 is about one and a half Vt above Vss. For example, if Vss is zero, V2 is about 1.5 Vt. The upper limit of the input range is about one Vt above the minimum value of the output voltage of node 216 or 218. The output voltage depends on the supply voltage Vcc.

For the purpose of better understanding the function of current regulator 204, the following two examples describe the operation of differential amplifier 202 without current regulator 204. In differential amplifier 202, when the voltage levels of the INA and INB signals exceed the normal input range (FIG. 3), differential amplifier 202 could operate improperly.

For example, when the voltage levels of the INA and INB signals increase, both transistors 224 and 226 become less resistive and pull up node 234. When the voltage levels of the INA and INB signals go higher than V3 (FIG. 3) transistors 224 and 226 begin to operate in linear mode (or triode mode). In the linear mode, the resistances of transistors 224 and 226 can become substantially small such that nodes 216 and 218 are virtually shorted. This causes differential amplifier 202 to operate improperly.

As another example, when the voltage levels of the INA and INB signals go lower than V2 to a level such as V1 (FIG. 3) transistors 224 and 226 could turn off. This causes differential amplifier 202 to operate improperly.

Current regulator 204 allows differential amplifier 202 to operate properly even when the INA and INB signals go below the lower limit of V2 (FIG. 3).

When the voltage levels of the INA and INB signals decrease, the voltage level of node 234 also decreases. When the voltage levels of the INA and INB signals go lower than V2 to a level such as V1 (FIG. 3), the voltage level of node 234 decreases and causes transistor 228 to operate in the linear mode. In the linear mode, transistor 228 acts as a resistor in which the current flowing through the transistor depends on the drain-to-source voltage of the transistor. Thus, when the drain voltage of transistor 228 at node 234 decreases, current I flowing through transistor 228 also decreases proportionally.

To compensate for the decrease in current I, current regulator 204 decreases the resistance of transistor 228 to pull current I back up to the level that exists before transistor 228 enters the linear mode. When the voltage levels of the INA and INB signals decrease, transistors 224 and 226 of differential unit 242 and transistors 210 and 212 of current regulator 204 allow node 234 to be pulled down by transistor 228. With the voltage of node 234 reduced, the current of transistor 228 reduces either due to less than ideal saturation effects or due to falling into the linear region. Regulator current source 248 will start to increase the voltage level of the gate of transistor 228 at node 229. This increases current I.

The increase in current I caused by current regulator 204 compensates the decrease in current I caused by differential amplifier 202. As a result, current regulator 204 keeps current I constant between operating modes of transistor 228 when the INA and INB signals go from V2 to V1 (FIG. 2B). When current I is constant, differential amplifier 202 operates properly. Hence, current regulator 204 effectively increases the normal input range of differential amplifier 202 and still allows differential amplifier 202 to operate properly.

Figure 4:
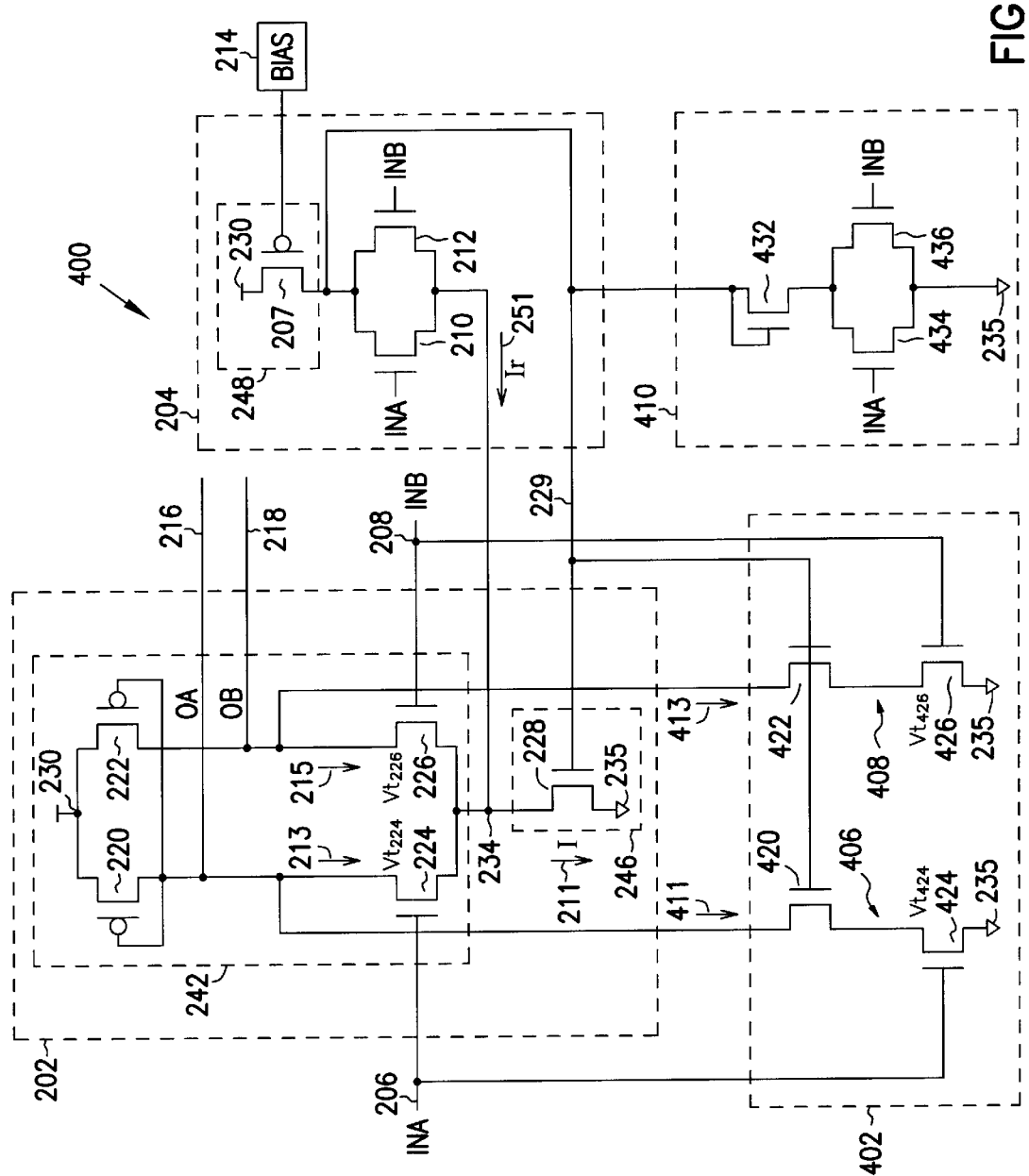
FIG. 4 shows an amplifying circuit according to another embodiment of the invention.

FIG. 4 shows an amplifying circuit according to another embodiment of the invention. Circuit 400 includes a differential amplifier 202, a current regulator 204, an input enhancement unit 402, and a bias control unit 410. Differential amplifier 202, and current regulator 204 are similar to that of circuit 201 of FIG. 2B.

Input enhancement unit 402 has first and second stacks of transistors 406 and 408. Each of the stacks of transistors 406 and 408 connects in parallel with one of the transistors 224 and 226 in between one of the nodes 216 and 218 and node 235. For example, stack of transistors 406 connects between nodes 216 and 235. Stack of transistors 408 connects between nodes 218 and 235.

Stack of transistors 406 includes a control transistor 420 connected in series with an input transistor 424. Transistor 420 has a gate connected to node 229. Transistor 424 has a gate connected to input node 206.

Stack of transistors 408 includes a control transistor 422 connected in series with an input transistor 426. Transistor 422 has a gate connected to node 229. Transistor 426 has a gate connected to input node 208.

Transistors 224 and 226 have threshold voltages $Vt_{224}$ and $Vt_{226}$. Transistors 424 and 426 have threshold voltages $Vt_{424}$ and $Vt_{426}$. In some embodiments, $Vt_{424}$ is smaller than $Vt_{224}$ and $Vt_{426}$ is smaller than $Vt_{226}$.

Bias control unit 410 connects to a path that is located between nodes 229 and 235. Bias control unit 410 includes a diode-connected transistor 432. Transistor 432 connects in series with a pair of transistors 434 and 436. Each of the transistors 434 and 436 has a drain connected to transistor 432, a source connected to the supply node 235, and a gate connected to one of the first and second input nodes 206 and 208 to receive one of the INA and INB signals.

Figure 5:
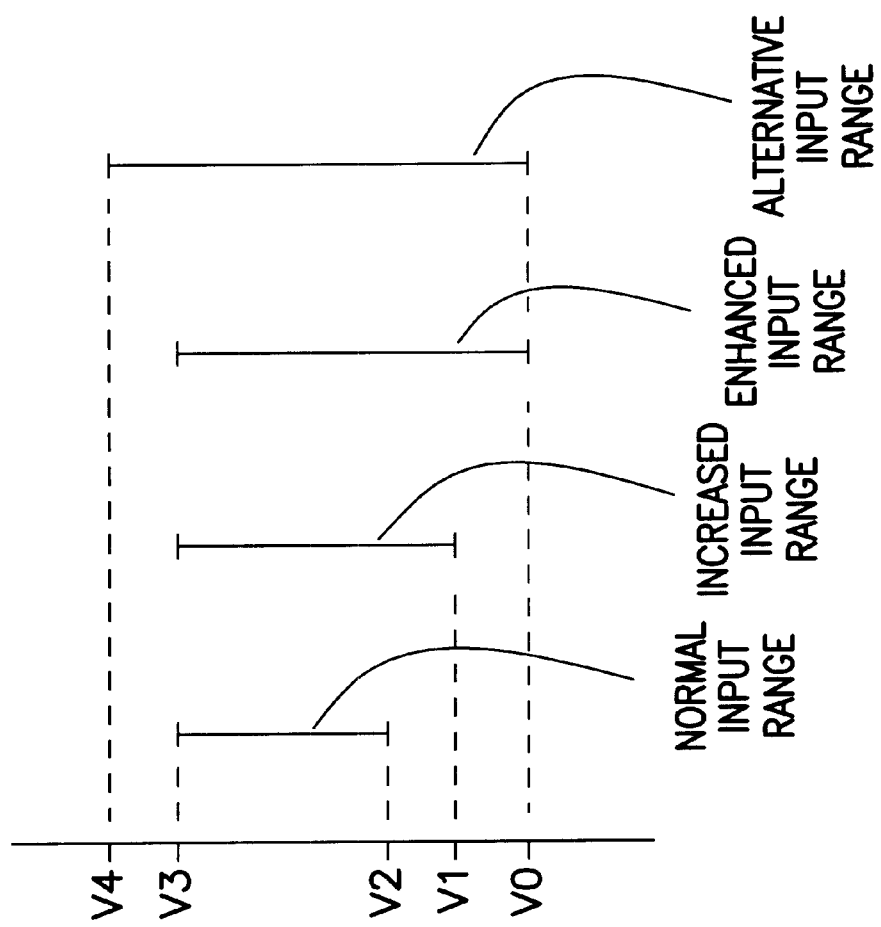
FIG. 5 shows an input range for the amplifying circuit of FIG. 4.

Input enhancement unit 402 increases the lower limit of the input range of differential amplifier 202 of FIG. 4 to be larger than the input range of differential amplifier 202 of FIG. 2B. FIG. 5 shows the input range of differential amplifier 202. The enhanced input range is the input range of differential amplifier 202 of FIG. 4. The normal and increased input ranges are shown as reference ranges for comparison purposes. The enhanced input range has a lower limit of V0 and an upper limit of V3. As shown in FIG. 5, the enhanced input range is larger than either one of the normal and increased input ranges.

In some alternative embodiments, the upper limit of the enhanced input range can be increased by increasing $Vt_{224}$ and $Vt_{226}$ of transistors 224 and 226. For example, $Vt_{224}$ and $Vt_{226}$ can be increased to certain values such that the upper limit of the enhanced input range increases to V4. In these alternative embodiments, differential amplifier 202 has an alternative input range (FIG. 5) with a lower limit of V0 and an upper limit of V4. Thus, the alternative input range of differential amplifier 202 has increases in both the lower limit and the upper limit in comparison to the normal input range.

In FIG. 4, transistors 424 and 426 increase the lower limit of the normal input range. Transistors 420 and 422 control the current on current paths 413 and 415. Bias control unit 410 and current regulator 204 control the voltage on node 229 at the gates of transistors 228, 420, 422, and 432.

Figure 6:
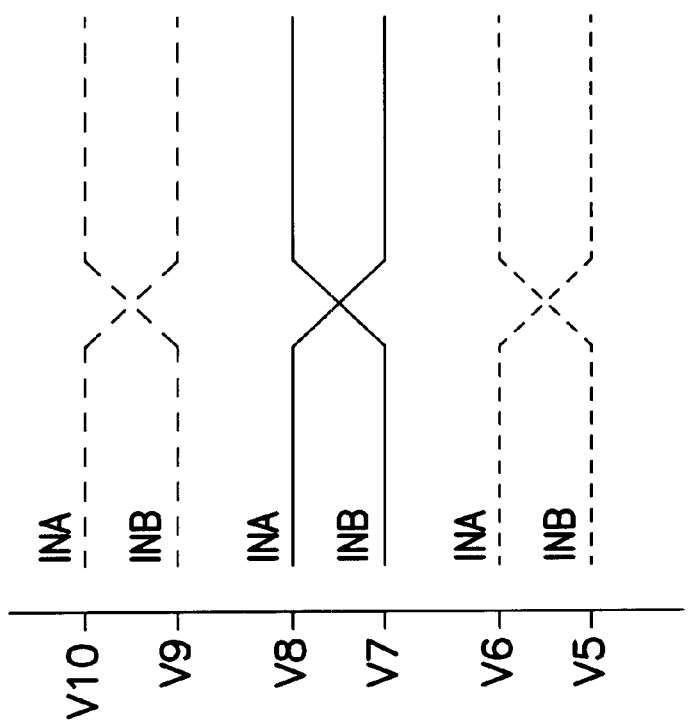
FIG. 6 shows various signal levels of input signals of the amplifying circuit of FIG. 4.

FIG. 6 shows various levels of the input signals of FIG. 4. The INA and INB signals vary between various signal levels. For example, the INA and INB signals initially have signal levels at V8 and V7. When the INA and INB signals decrease from the initial signal levels, the decreased signals levels are V6 and V5. The INA signal decreases from V8 to V6 and the INB signal decreases from V7 to V5. When the INA and INB signals increase from the initial signal levels, the increased signals levels are V10 and V9. The INA signal increases from V8 to V10 and the INB signal increases from V7 to V9. V5 through V10 are voltage levels.

In some embodiments, V5 is the lower limit and V10 is the upper limit of the input range of differential amplifier 202. The INA and INB signals can vary from one set of signal levels to any other set of signal levels. For example, the INA and INB signals can move from first signal levels of V6 and V5 to second signal levels of V10 and V9, and vice versa.

The operation of circuit 400 is better understood by examining the operations of transistors 224, 420, and 424 together, and the operations of transistors 226, 422, and 426 together. When the voltage level of the INA signal decreases below $Vt_{224}$ of transistor 224 but higher than $Vt_{424}$ of transistor 424, transistor 224 turns off, transistor 420 turns on or turns on more, and transistor 424 remains on. For example, when the INA signal decreases to about V6 (FIG. 6), transistor 224 turns off, transistor 420 turns on or turns on more, and transistor 424 remains on. In this case, transistor 424 acts as a replacement for transistor 224 since transistor 420 enables a current path for transistor 424. With transistor 224 turning off, a majority of current is steered to transistor 424 through current path 411.

Similarly, when the voltage level of the INB signal decreases toward the lower limit and below $Vt_{226}$ of transistor 226 but higher than $Vt_{426}$ of transistor 426, transistor 226 turns off, transistor 422 turns on or turns on more, and transistor 426 remains on. For example, when the INB signal decreases to about V5 (FIG. 6) transistor 226 turns off, transistor 422 turns on or turns on more, and transistor 426 remains on. In this case, transistor 426 acts as a replacement for transistor 226 since transistor 422 enables a current path for transistor 426. With transistor 226 turning off, a majority of current is steered to transistor 426 through current path 413.

Thus, when the INA and INB signals decrease near the lower limit, transistors 424 and 426 replace the functions of transistors 224 and 226 and increase the lower limit of the normal input range. The majority of current on a first current path is steered to a second current path and is drawn by transistors 424 and 426. In FIG. 4, the first current path includes paths 213 and 215 and the second current path includes current paths 411 and 413.

When the voltage levels of the INA and INB signals increase toward the upper limit, transistors 224 and 226 turn on and operate in the saturation mode. For example, when the INA and INB signals increase from V6 and V5 to V10 and V9 (FIG. 6), transistors 224 and 226 turn on. In this case, the majority of current goes through path 211. Transistors 424 and 426 remain on but are now in linear mode. However, the currents going through current paths 411 and 413 to transistors 424 and 426 are limited by transistors 420 and 422 to keep differential amplifier 202 operating properly. When the INA and INB signals increase, bias control unit 410 and current regulator 204 decrease the voltage level of node 229 at the gates of transistors 420 and 422. This causes transistors 420 and 422 to become more resistive or possibly off, thereby limiting or stopping the currents going to transistors 424 and 426. Further, current regulator 204 holds current I constant to maintain the proper operation of differential amplifier 202.

Figure 7:
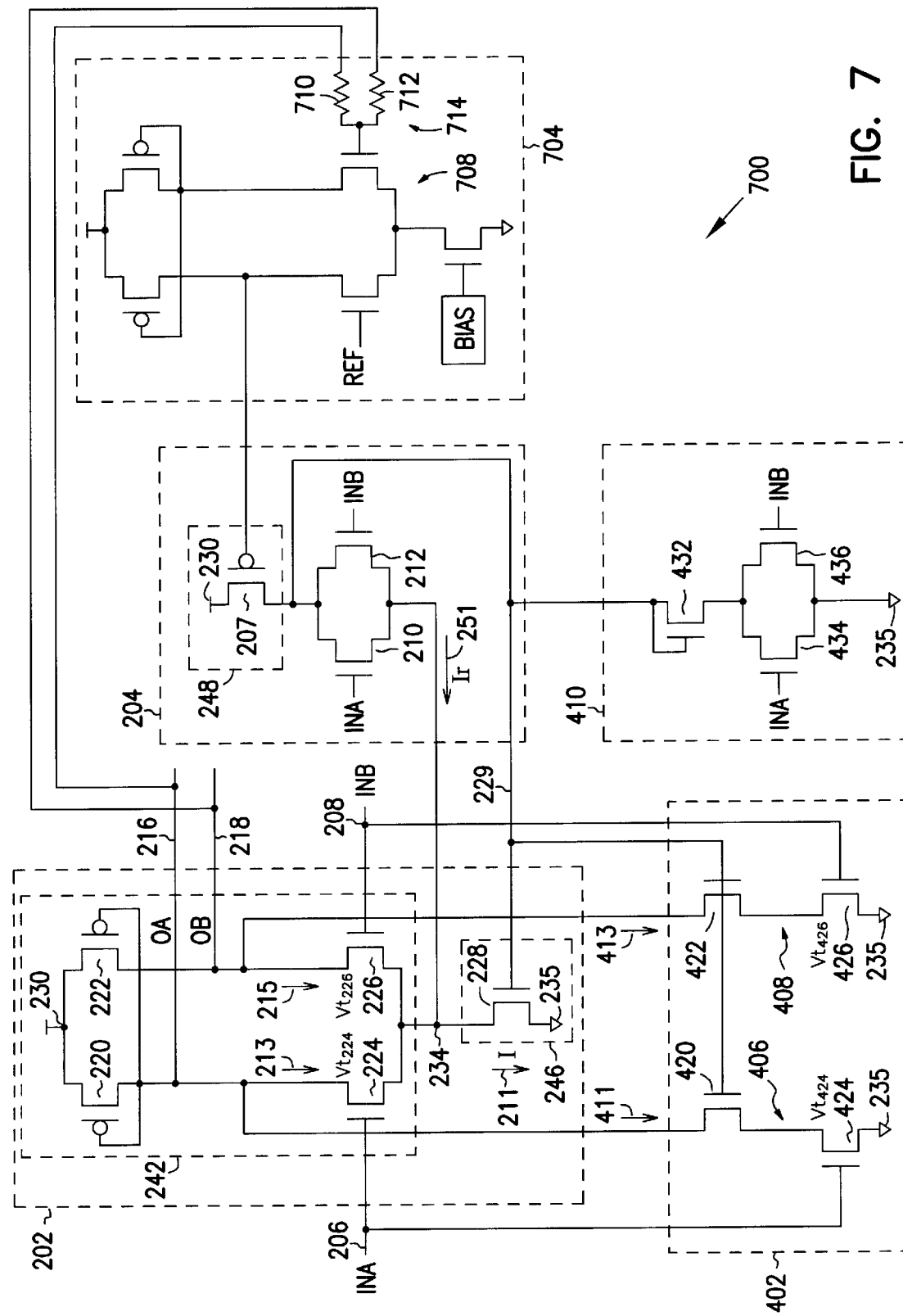
FIG. 7 shows an amplifying circuit according to another embodiment of the invention.

FIG. 7 shows an amplifying circuit according to another embodiment of the invention. Circuit 700 is the same as circuit 400 except for the addition of a current regulator bias unit 704 connected between current regulator 204 and differential amplifier 202. Bias unit 704 includes a first input for receiving a reference voltage REF and a second input connected to resistors 710 and 712 of a resistive network 714. Resistor 710 connects between the second input node and node 216. Resistor 712 connects between the second input node and node 218. Differential amplifier 708 has an output that connects to the gate of transistor 207.

Control unit 704 controls the gate of transistor 207 so that the relationship between the input range of input signals INA and INB and output signals OA and OB can be improved. The voltage level at the gate of transistor 207 can be selected by selecting the voltage of reference signal REF. Circuit 700 increases the normal input range of differential amplifier 202 and operates in a similar fashion as circuit 400 (FIG. 4).

Figure 8:
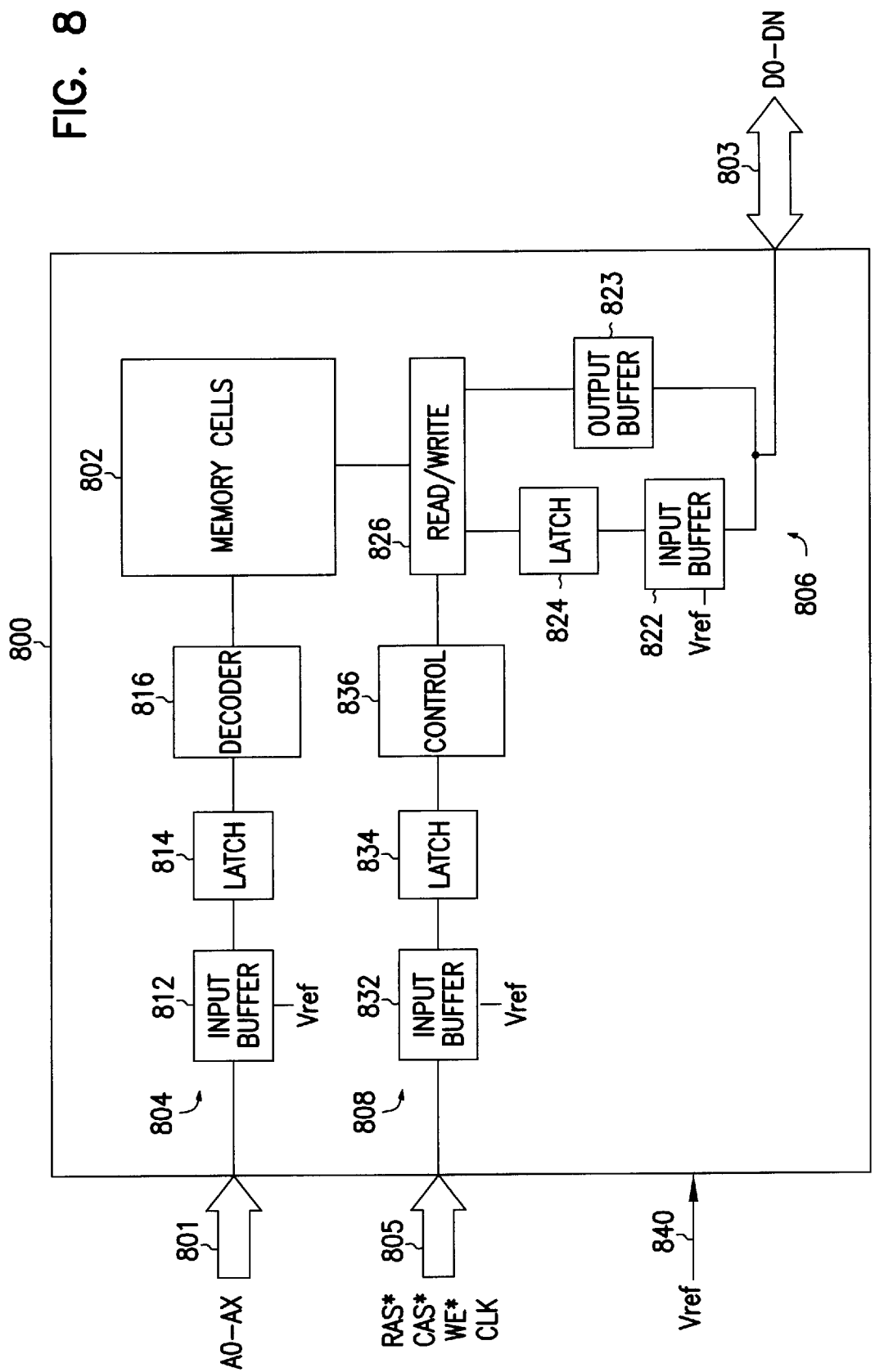
FIG. 8 shows a memory device according to an embodiment of the invention.

FIG. 8 shows a memory device 800 according to an embodiment of the invention. Memory 800 includes a plurality of address lines 801 for receiving a plurality of address signals AO–AX, a plurality of data lines 803 for transferring a plurality of data signals DO–DN, and a plurality of control lines 805 for receiving a plurality of control signals. An example of the control signals include, row access strobe (RAS*), column access strobe (CAS*), write enable (WE*), and clock (CLK). In some embodiments, the address, data, and control lines 801, 803, and 805 represent external pins of memory device 800.

Memory device 800 further includes a plurality of memory cells 802 for storing data. Memory cells 802 connect to an address path 804, a data path 806, and a control path 808. Address path 804 includes an input buffer 812, a latch 814, and a decoder 816. Data path 806 includes an input buffer 822, a latch 824, an output buffer 823, and a data read/write circuit 826. Control path 808 includes an input buffer 832, a latch 834, and a control circuit 836. Address path 804 connects to address lines 801 to operate on one of the address signals AO–AX. Data path 806 connects to data lines 803 to operate on one of the data signals DO–DN. Control path 808 connects to control lines 805 to operate on one of the control signals RAS*, CAS*, WE*, and CLK.

Memory device 800 further includes other address paths, data paths, and control paths that are similar to address path 804, data path 806, and control path 808. The other address, data, and control paths also connect to address, data, and control lines 801, 803, and 805 in similar fashions as address path 804, data path 806, and control path 808. However, for simplicity, FIG. 8 only shows one of each of the address, data, and control paths.

Memory device 800 further includes a reference line 840 to provide a reference signal Vref. In some embodiments, the Vref signal is provided to line 840 by a circuit or a device that is external to memory device 800. In other embodiments, the Vref signal is provided to line 840 by an internal circuit of memory device 800. In embodiments represented by FIG. 8, the input buffer from each of the address, data, and control paths connects to line 840 to receive the Vref signal.

Input buffers 812, 822, and 832 can include anyone of the amplifying circuits in this specification. When one of the amplifying circuits is used as one of the input buffers, output nodes 216 and 218 of the amplifying circuit (FIG. 2B or others) represent reference line 840 and one of the address, data, or control lines. For example, when amplifying circuit 201 is used as input buffer 812, node 206 represents one of the address lines 801, and node 208 represents reference line 840. In this case, the INA signal of amplifying circuit 201 represents one of the address signals AO–AX, and the INB signal of amplifying circuit 201 represents the Vref signal.

Each of the input buffers on the address, data, and control path receives the Vref signal and a corresponding signal from the address, data, and control paths. The input buffers operate on the address, data, and control signals and the Vref signal to provide latches 814, 824, and 834 signals representing logic levels of the address, data, and control signals. Based on the signals at the latches, the address, data, and control paths perform appropriate functions to access memory cells 802. Since the input buffers of memory device 800 can include anyone of the amplifying circuits of the specification, and the input buffers have increased input range, the overall operation of memory device 800 is improved.

The overall operation of memory device 800 is similar to the operation of a typical memory device. Therefore, the operation of memory device 800 is not described in detail in the specification. Decode circuit 816 decodes the logic levels of the address signals AO–AX at latch 814 to identify a location of a selected memory cell, so that data can be read from or written into the selected memory cell. In some embodiments, decode circuit 816 includes a row decoder and a column decoder to decode a row address and a column address of the memory cell. Control circuit 836 decodes the logic levels of the control signals RAS*, CAS*, and WE* at latch 834 to determine whether a read or a write operation will be performed. Read/write circuit 826 reads data from a selected memory cell during a read operation, and writes data into a selected memory cell represented by the DO–DN signals at latch 824 during a write operation.

Memory device 800 can be a dynamic random access memory (DRAM) or other types of memory circuits such as SRAM (Static Random Access Memory) or Flash memories. Furthermore, the DRAM could be a synchronous DRAM commonly referred to as SDRAM (Synchronous Dynamic Random Access Memory), DDR SDRAM (Double Data Rate SDRAM), DDRII SDRAM, or SGRAM (Synchronous Graphics Random Access Memory), and RLDRAM (Reduced Latency DRAM), RLDRAMII, or Rambus DRAMs. Those of ordinary skill in the art will recognize that memory device 800 is simplified to illustrate a memory device according to an embodiment of the present invention. Therefore, memory device 800 is not intended to be a detailed description of all of the features of a memory device.

Figure 9:
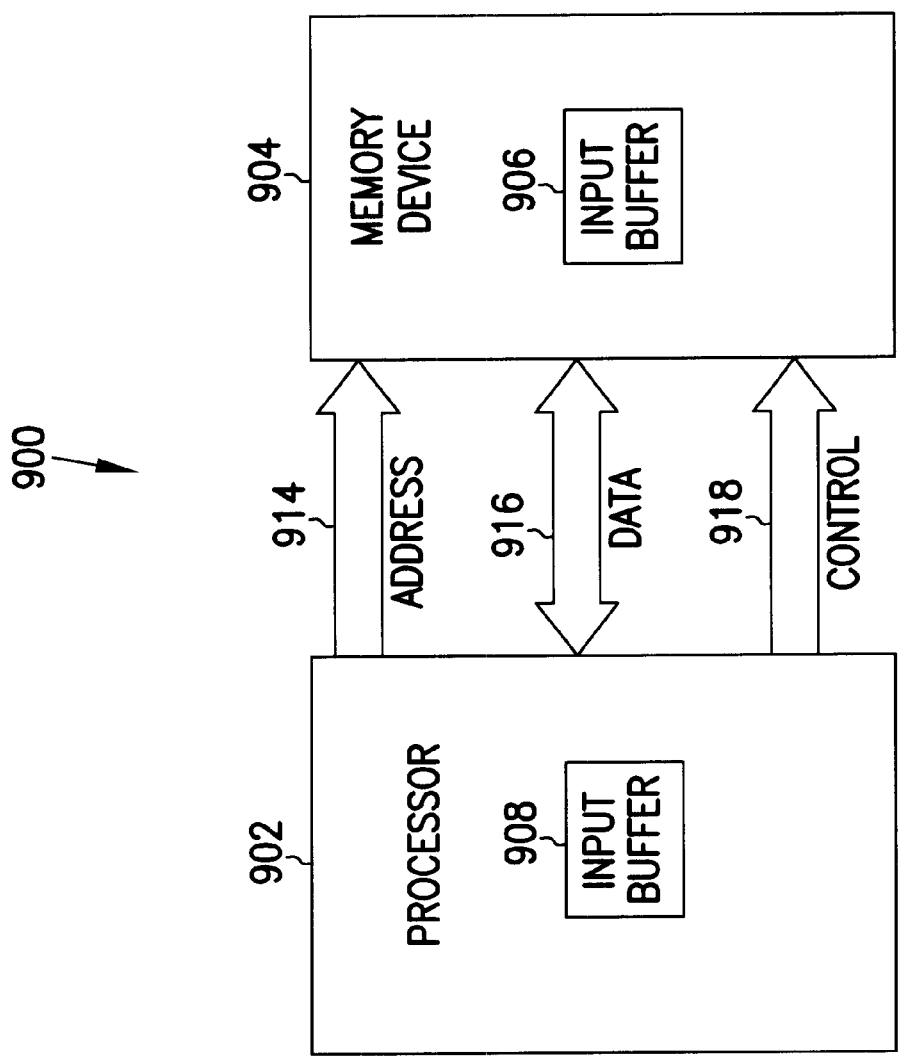
FIG. 9 shows a system according to an embodiment of the invention.

FIG. 9 shows a system according to an embodiment of the invention. System 900 includes a first integrated circuit (IC) 902 and a second IC 904. ICs 902 and 904 can include processors, controllers, memory devices, application specific integrated circuits, and other types of integrated circuits. In embodiments represented by FIG. 9, for example, IC 902 is represented by a processor, and IC 904 is represented by a memory device. Processor 902 and memory device 904 communicate using address signals on lines 914, data signals on lines 916, and control signals on lines 918.

Memory device 904 can also be memory device 800 of FIG. 8. Therefore, memory device 904 includes many circuit elements, and address, data, and control paths such as address, data, and control paths 804, 806, and 808 of memory device 800. As shown in FIG. 9, memory device 904 includes at least one input buffer in each of the address, data, and control paths. For simplicity, memory device 904 shows only one input buffer 906. In addition, processor 902 also includes an input buffer 908 to receive differential signals such as the INA and INB signals described in the specification. Input buffer 906 or 908 can include anyone of the amplifying circuits in this specification. The operation of memory device 904 is similar to the operation of memory device 800.

System 900 represented by FIG. 9 includes computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Conclusion

Various embodiments of the invention describe circuits and methods for increasing the normal input range of differential amplifiers to allow the input signals to exceed the lower and upper limits of the normal input range. Although specific embodiments are described herein, those skilled in the art recognize that other embodiments may be substituted for the specific embodiments shown to achieve the same purpose. This application covers any adaptations or variations of the present invention. Therefore, the present invention is limited only by the claims and all available equivalents.

What is claimed is:

1. A circuit comprising:
    a differential amplifier including a pair of driver transistors for receiving input signals and including output nodes;
    a current regulator connected to the differential amplifier for regulating a current of a first current path of the differential amplifier based on first signal levels of the input signals, the first current path being located between the output nodes and a supply node; and
    an input enhancement unit connected to the differential amplifier and the current regulator for steering a majority of the current from the first current path to a second current path based on second signal levels of the input signals, the second current path being different from the first current path and being located between the output nodes and the supply node.

2. The circuit of claim 1, wherein the current regulator includes a pair of regulator transistors for holding the current of the first current path constant based on signal levels of the input signals.

3. The circuit of claim 1, wherein the input enhancement unit includes a pair of input transistors for drawing the majority of current from the first current path based on the second signal levels of the input signals.

4. The circuit of claim 3, wherein the input enhancement unit further includes a pair of control transistors for controlling currents flowing through the pair of input transistors.

5. The circuit of claim 4 further comprising a bias control unit connected to the input enhancement unit for controlling the pair of control transistors based on signal levels of the input signals.

6. A circuit comprising: a differential amplifier having a pair of load transistors connected to a pair of driver transistors at a first output node and a second output node, and a current source transistor connected to a common node shared by sources of the pair of driver transistors;
    a current regulator connected to the common node and a gate of the current source transistor;
    a first stack of transistors connected between the first output node and a first supply node; and
    a second stack of transistors connected between the second output node and the first supply node.

7. The circuit of claim 6 further comprising a bias control unit connected to the first and second stacks of transistors for controlling currents flowing through the first and second stacks of transistors based on input signals provided to the differential amplifier.

8. The circuit of claim 6, wherein the current regulator includes a first regulator transistor including a source connected to the common node, a drain connected to the gate of current source transistor, and a gate connected to a first input node of the differential amplifier;
    a second regulator transistor including a source connected to the common node, a drain connected to the gate of current source transistor, and a gate connected to a second input node of the differential amplifier; and
    a load device connected between the gate of current source transistor and a second supply node.

9. The circuit of claim 8 further comprising a current regulator bias unit connected between the current regulator and the differential amplifier.

10. The circuit of claim 6, wherein the first stack of transistors includes:
    a first input transistor having a gate connected to a gate of a first driver transistor of the pair of driver transistor at a first input node of the differential amplifier; and
    a first control transistor connected between the first input transistor and the first output node.

11. The circuit of claim 10, wherein the second stack of transistors includes:
    a second input transistor having a gate connected to a gate of a second driver transistor of the pair of driver transistor at a second input node of the differential amplifier; and
    a second control transistor connected between the second input transistor and the second output node.

12. The circuit of claim 11, wherein the second input transistor has a lower threshold voltage than the second driver transistor.

13. The circuit of claim 10, wherein the first input transistor has a lower threshold voltage than the first driver transistor.

14. A memory device comprising:
    a plurality of memory cells; and
    an address path, a data path, and a control path, all paths connected to the memory cells, wherein at least one of the paths includes an input buffer, the input buffer including:
        a differential amplifier including a pair of driver transistors for receiving input signals and including output nodes;
        a current regulator connected to the differential amplifier for regulating a current of a first current path of the differential amplifier based on first signal levels of the input signals, the first current path being located between the output nodes and a supply node; and
        an input enhancement unit connected to the differential amplifier and the current regulator for steering a majority of the current from the first current path to a second current path based on second signal levels of the input signals, the second current path being different from the first current path and being located between the output nodes and the supply node.

15. The memory device of claim 14, wherein the current regulator includes a pair of regulator transistors for holding the current of the first current path constant based on signal levels of the input signals.

16. The memory device of claim 14, wherein the input enhancement unit includes a pair of input transistors for drawing the majority of current from the first current path based on the second signal levels of the input signals.

17. The memory device of claim 16, wherein the input enhancement unit further includes a pair of control transistors for controlling currents flowing through the pair of input transistors.

18. The memory device of claim 17 further comprising a bias control unit connected to the input enhancement unit for controlling the pair of control transistors based on signal levels of the input signals.

19. A memory device comprising:
a plurality of memory cells; and
an address path, a data path, and a control path, all paths connected to the memory cells,
wherein at least one of the paths includes an input buffer, the input buffer including: a differential amplifier having a pair of load transistors connected to a pair of driver transistors at a first output node and a second output node, and a current source transistor connected to a common node shared by sources of the pair of driver transistors;
a current regulator connected to the common node and a gate of the current source transistor;
a first stack of transistors connected between the first output node and a first supply node; and
a second stack of transistors connected between the second output node and the first supply node.

20. The memory device of claim 19 further comprising a bias control unit connected to the first and second stacks of transistors for controlling currents flowing through the first and second stacks of transistors based on input signals providing to the differential amplifier.

21. A system comprising:
a processor; and
a memory device connected to the processor, the memory device including: a plurality of memory cells; and
an address path, a data path, and a control path, all paths connected to the memory cells, wherein at least one of the paths includes an input buffer, the input buffer including:
a differential amplifier including a pair of driver transistors for receiving input signals and including output nodes;
a current regulator connected to the differential amplifier for regulating a current of a first current path of the differential amplifier based on first signal levels of the input signals, the first current path being located between the output nodes and a supply node; and
an input enhancement unit connected to the differential amplifier and the current regulator for steering a majority of the current from the first current path to a second current path based on second signal levels of the input signals, the second current path being different from the first current path and being located between the output nodes and the supply node.

22. The system of claim 21, wherein the current regulator includes a pair of regulator transistors for holding the current of the first current path constant based on signal levels of the input signals.

23. The system of claim 21, wherein the input enhancement unit includes a pair of input transistors for drawing the majority of current from the first current path based on the second signal levels of the input signals.

24. The system of claim 23, wherein the input enhancement unit further includes a pair of control transistors for controlling currents flowing through the pair of input transistors.

25. The system of claim 24 further comprising a bias control unit connected to the input enhancement unit for controlling the pair of control transistors based on signal levels of the input signals.

26. A system comprising:
a processor; and
a memory device connected to the processor, the memory device including:
a plurality of memory cells; and
an address path, a data path, and a control path, all paths connected to the memory cells, wherein at least one of the paths includes an input buffer, the input buffer including:
a differential amplifier having a pair of load transistors connected to a pair of driver transistors at a first output node and a second output nodes, and a current source transistor connected to a common node shared by sources of the pair of driver transistors;
a current regulator connected to the common node and a gate of the current source transistor;
a first stack of transistors connected between the first output node and a first supply node; and
a second stack of transistors connected between the second output node and the first supply node.

27. The system of claim 26 further comprising a bias control unit connected to the first and second stacks of transistors for controlling currents flowing through the first and second stacks of transistors based on input signals providing to the differential amplifier.

28. A method of operating an amplifying circuit, the method comprising:
receiving input signals at a differential amplifier;
regulating a current of a first current path of the differential amplifier based on first signal levels of the input signals, the first current path being located between output nodes of the differential amplifier and a supply node; and
steering the current from the first current path to a second current path based on second signal levels of the input signals, the second current path being different from the first current path and being located between the output nodes and the supply node.

29. The method of claim 28, wherein regulating a current of a first current path includes holding the current constant when the input signals vary from the first signal levels to the second signal levels.

30. The method of claim 28, wherein steering the current includes steering a majority of the current from the first current path to the second current path.

31. The method of claim 28, wherein steering the current includes limiting the current on the second current path.

32. A method of comprising:
receiving input signals at an amplifying circuit;
generating output signals based on a first current path when the input signals have first signal levels, the first current path being located between output nodes of the amplifying circuit and a supply node; and
generating the output signals based on a second current path when the input signals have second signal levels, the second current path being different from the first current path and being located between the output nodes and the supply node.

33. The method of claim 32, wherein generating output signals based on a first current path includes regulating a current of the first current path.

34. The method of claim 33, wherein regulating a current of the first current path includes holding the current constant.

35. The method of claim 32, wherein generating output signals based on a second current path includes steering current from the first current path to the second current path.

36. The method of claim 35, wherein steering current includes steering a majority of the current from the first current path to the second current path.

37. The method of claim 36, wherein steering current includes limiting the current of the second current path.

38. A method comprising:

receiving input signals having first signal levels at a pair of driver transistors;

receiving the input signals at a pair of input transistors connected in parallel with the pair of driver transistors;

regulating a current of a first current path controlled by the pair of driver transistors, the first current path being located between drains of the pair of driver transistors and a supply node wherein current in the first current path passes from the drains of the pair of driver transistors to the supply node through the pair of driver transistors; and steering current from the first current path to a second current path controlled by the pair of input transistors when the input signals change to second signal levels, the second current path being different from the first current path, wherein current in the second current path passes from the drains of the pair of driver transistors to the supply node through the pair of input transistors.

39. The method of claim 38, wherein regulating a current of a first current path includes holding the current constant between the first and second signal levels of the input signals.

40. The method of claim 38, wherein steering current includes steering a majority of the current from the first current path to the second current path.

41. The method of claim 38, wherein steering current includes limiting the current on the second current path.

42. A circuit comprising:

a differential amplifier having a first differential input node and a second amplifier input node for receiving differential input signals, and having an amplifier current source; and a current regulator connected to the differential amplifier, the current regulator including:

a pair of input transistors having shared sources and shared drains receiving the differential input signals to regulate a current of the differential amplifier; and a regulator current source connected to the shared drains, wherein the shared drains connect to a control node of the amplifier current source.

43. The circuit of claim 42, wherein the shared sources connect to a common node of the amplifier current source.

44. The circuit of claim 42, wherein the current regulator is configured to regulate a current of a first current path of the differential amplifier based on first signal levels of the input signals.

45. The circuit of claim 44 further comprising an input enhancement unit connected to the differential amplifier and the current regulator for steering a majority of the current from the first current path to a second current path based on second signal levels of the input signals.

46. The circuit of claim 45, wherein the input enhancement unit includes a pair of input transistors for drawing the majority of current from the first current path based on the second signal levels of the input signals.

47. The circuit of claim 46, wherein the input enhancement unit further includes a pair of control transistors for controlling currents flowing through the pair of input transistors.

48. The circuit of claim 47 further comprising a bias control unit connected to the input enhancement unit for controlling the pair of control transistors based on signal levels of the input signals.

* * * * *